US010008606B2

(12) United States Patent
Ishida et al.

(10) Patent No.: US 10,008,606 B2
(45) Date of Patent: Jun. 26, 2018

(54) THIN FILM TRANSISTOR AND DISPLAY PANEL

(71) Applicant: Sakai Display Products Corporation, Sakai-shi, Osaka (JP)

(72) Inventors: Shigeru Ishida, Sakai (JP); Nobutake Nodera, Sakai (JP); Ryohei Takakura, Sakai (JP); Yoshiaki Matsushima, Sakai (JP); Takao Matsumoto, Sakai (JP); Kazuki Kobayashi, Sakai (JP); Taimi Oketani, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days. days.

(21) Appl. No.: 15/561,686

(22) PCT Filed: Mar. 30, 2015

(86) PCT No.: PCT/JP2015/059860
§ 371 (c)(1),
(2) Date: Sep. 26, 2017

(87) PCT Pub. No.: WO2016/157351
PCT Pub. Date: Oct. 6, 2016

(65) Prior Publication Data
US 2018/0097120 A1 Apr. 5, 2018

(51) Int. Cl.
*H01L 29/786* (2006.01)
(52) U.S. Cl.
CPC .. *H01L 29/78663* (2013.01); *H01L 29/78669* (2013.01); *H01L 29/78672* (2013.01); *H01L 29/78678* (2013.01)

(58) Field of Classification Search
CPC .............. H01L 29/78669; H01L 29/78678
See application file for complete search history.

(56) References Cited

U.S. PATENT DOCUMENTS 6,232,622 B1 * 5/2001 Hamada ............ H01L 29/66757
257/350
2005/0050896 A1 * 3/2005 McMasters ............ F23M 5/085
60/748

(Continued)

FOREIGN PATENT DOCUMENTS

JP 2000-114529 A * 4/2000
JP 2000-114529 A   4/2000

(Continued)

OTHER PUBLICATIONS

English translation of JP 2011-029411 Feb. 2011.*

*Primary Examiner* — Asok K Sarkar
*Assistant Examiner* — Grant Withers
(74) *Attorney, Agent, or Firm* — Bret E. Field; Bozicevic, Field & Francis LLP

(57) ABSTRACT

The thin film transistor includes a gate electrode formed on a surface of a substrate; a first amorphous silicon layer formed on an upper side of the gate electrode; a plurality of polysilicon layers separated by the first amorphous silicon layer and formed on the upper side of the gate electrode with a required spaced dimension; a second amorphous silicon layer and an n+ silicon layer which are formed on the upper side of the plurality of polysilicon layers and the first amorphous silicon layer; and a source electrode and a drain electrode formed on the n+ silicon layer.

9 Claims, 15 Drawing Sheets

(56) References Cited

U.S. PATENT DOCUMENTS

2005/0139923 A1\* 6/2005 Kwon ................ H01L 27/1285
257/347
2009/0050896 A1 2/2009 Kaitoh et al.

FOREIGN PATENT DOCUMENTS

| | | | |
|---|---|---|---|
| JP | 2005-197719 A | | 7/2005 |
| JP | 2011-029411 A | \* | 2/2011 |
| JP | 5226259 B2 | | 7/2013 |
| WO | WO2011010611 A1 | | 1/2011 |

\* cited by examiner

F I G. 13
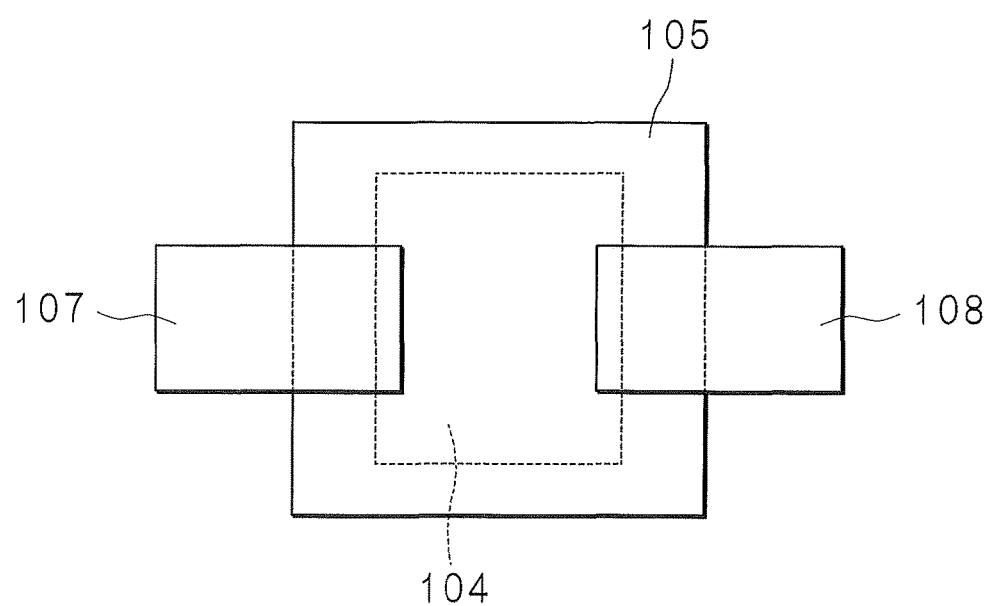

THIN FILM TRANSISTOR AND DISPLAY PANEL

CROSS-REFERENCE TO RELATED APPLICATIONS

This application is the national phase under 35 U.S.C. § 371 of PCT International Application No. PCT/JP2015/059860 which has an International filing date of Mar. 30, 2015 and designated the United States of America.

FIELD

The present invention relates to a thin film transistor and a display panel including the thin film transistor.

BACKGROUND

A thin film transistor (TFT) type liquid crystal display includes a TFT substrate and a color filter substrate having red (R), green (G) and blue (B) colors, in which the TFT substrate and the color filter substrate are bonded to each other at a required gap, and liquid crystal is injected and sealed therebetween, and may display an image by controlling transmittance of light by liquid crystal molecules for each pixel.

In the TFT substrate, data lines and scanning lines are wired in a lattice shape in longitudinal and lateral directions, and pixels including the TFTs are formed at places in which the data lines and the scanning lines intersect with each other. In addition, a driving circuit, which includes the TFTs and drives the data lines and the scanning lines, is formed around a display region including a plurality of pixels.

There are two types of TFTs, an amorphous silicon (a-Si) TFT in an amorphous state and a polycrystalline silicon (p-Si) TFT in a polycrystalline state depending on the crystalline state of a semiconductor (silicon). The a-Si TFT has a high resistance and a low leakage current (leak current). In addition, the p-Si TFT has dramatically higher mobility of electrons than that of the a-Si TFT. For this reason, the a-Si TFT having the low leakage current is used for each pixel included in the display region, and the p-Si TFT having the higher mobility of electrons is used for the driving circuit.

Meanwhile, from a structure viewpoint of the TFT, generally, the a-Si TFT uses a bottom gate structure in which a gate electrode is disposed in the lowermost layer, and the p-Si TFT uses a top gate structure in which the gate electrode is disposed on an upper side of a semiconductor film. However, if TFTs having different structures from each other are formed on one substrate, a manufacturing process becomes complicated.

In this regard, a liquid crystal display device having a structure in which, in the TFT of the bottom gate structure, an a-Si layer is formed by covering a p-Si layer to prevent the p-Si layer and the source and drain electrodes from directly contacting with each other, is disclosed (see Japanese Patent Publication No. 5226259).

SUMMARY

However, in the liquid crystal display device of Japanese Patent Publication No. 5226259, the a-Si layer is formed on an entire substrate in advance, and the a-Si layer is changed to the p-Si layer in a polycrystalline state by irradiating the entire substrate with a laser. In addition, after the crystallization, the p-Si layer is formed on an entire channel region between the source electrode and the drain electrode via exposure, development and etching processes.

However, the p-Si layer has a high mobility of electrons, while has a problem that an off-current (also referred to as a leakage current) is increased. In the TFT of the top gate structure, as a method of reducing the off-current, a structure such as light doped drain (LDD) may be employed, but there are problems that the number of the manufacturing processes is increased and costs thereof are increased.

In consideration of the above-mentioned circumstances, it is an object of the present disclosure to provide a thin film transistor capable of reducing an off-current, and a display panel including the thin film transistor.

A thin film transistor according to the present disclosure includes a gate electrode formed on a surface of a substrate, a first amorphous silicon layer formed on an upper side of the gate electrode, a plurality of polysilicon layers separated by the first amorphous silicon layer and formed on the upper side of the gate electrode with a required spaced dimension, a second amorphous silicon layer and an n+ silicon layer which are formed on the upper side of the plurality of polysilicon layers and the first amorphous silicon layer, and a source electrode and a drain electrode formed on the n+ silicon layer.

According to the present disclosure, the thin film transistor includes: the gate electrode formed on the surface of the substrate; the first amorphous silicon layer (also referred to as an a-Si film) formed on the upper side of the gate electrode; the plurality of polysilicon layers (also referred to as a p-Si film) separated by the first amorphous silicon layer and formed on the upper side of the gate electrode with a required spaced dimension; the second amorphous silicon layer (also referred to as an a-Si film) and the n+ silicon layer which are formed on the upper side of the plurality of polysilicon layers and the first amorphous silicon layer; and the source electrode and the drain electrode formed on the n+ silicon layer.

That is, the channel region between the source electrode and the drain electrode includes a plurality of (for example, two) polysilicon layers, and the first amorphous silicon layer which separates the plurality of polysilicon layers so as to have the required spaced dimension. Further, when the source electrode and one polysilicon layer are projected on the surface of the substrate, a part of the source electrode and a part of the one polysilicon layer are adapted so as to be overlapped with each other. In addition, when the drain electrode and the other polysilicon layer are projected on the surface of the substrate, a part of the drain electrode and a part of the other polysilicon layer are adapted so as to be overlapped with each other.

Since the second amorphous silicon layer is intended so as to prevent the source and drain electrodes and the channel region from directly contacting with each other, a feature of having a low off-current is used. Since the channel region between the source electrode and the drain electrode forms a structure in which the polysilicon layers are separated by the first amorphous silicon layer, it is possible to more reduce the off-current than the case in which the entire channel region is formed as a polysilicon layer.

A thin film transistor according to the present disclosure, wherein the spaced dimension is in a range of 0.1 μm to 5 μm.

According to the present disclosure, the spaced dimension is within the range of 0.1 μm to 5 μm. As the conventional thin film transistor, in the process in which the entire substrate having the a-Si layer formed thereon is irradiated with a laser to change the a-Si layer to a p-Si layer in a polycrystalline state, and after the crystallization, the p-Si layer is formed using exposure, development and etching processes, it is very difficult to reduce the spaced dimension between adjacent polysilicon layers to less than 5 µm. On the other hand, by using a method in which a laser beam from a laser light source is made incident on a multi-lens array, for example, and the laser beam is partially irradiated via different optical paths for each lens (also referred to as a partial laser annealing), it is possible to decrease the spaced dimension between the adjacent polysilicon layers to about 0.1 µm. That is, by using the partial laser annealing, the spaced dimension between the polysilicon layers separated by the first amorphous silicon layer in the channel region may be set within the range of 0.1 µm to 5 µm.

A thin film transistor according to the present disclosure, wherein the spaced dimension is in a range of 1 µm to 2 µm.

According to the present disclosure, further, the spaced dimension is in the range of 1 µm to 2 µm. If the spaced dimension is set to be larger than 2 µm, a ratio of a length of the amorphous silicon layer to a length of the channel region is increased, and the mobility of electrons in the channel region is decreased. Meanwhile, if the spaced dimension is set to be smaller than 1 µm, the ratio of the length of the amorphous silicon layer to the length of the channel region becomes small, and the off-current exceeds the allowable value (for example, about 1 pA). Therefore, by setting the spaced dimension within the range of 1 µm to 2 µm, for example, it is possible to reduce the off-current without decreasing the mobility of electrons in the channel region.

A thin film transistor according to the present disclosure, wherein the first amorphous silicon layer has a thickness approximately equal to that of the plurality of polysilicon layers.

According to the present disclosure, the first amorphous silicon layer has the thickness approximately equal to that of the plurality of polysilicon layers. It can be seen that the plurality of polysilicon layers are obtained by changing only a region corresponding to a part of the channel region in the first amorphous silicon layer formed on the upper side of the gate electrode to the polysilicon layers which are in a polycrystalline state, and each processing of exposure, development and etching process for forming the channel region is not performed.

A thin film transistor according to the present disclosure, wherein a boundary surface between the plurality of polysilicon layers and the first amorphous silicon layer is substantially perpendicular to the surface of the substrate.

According to the present disclosure, the boundary surface between the plurality of polysilicon layers and the first amorphous silicon layer is substantially perpendicular to the surface of the substrate. Since the plurality of polysilicon layers are formed by partial laser annealing, the boundary surfaces between each of the plurality of polysilicon layers and the first amorphous silicon layer is substantially perpendicular to the surface of the substrate. That is, line widths of the polysilicon layers on the gate electrode side are not wider than the line widths thereof on the source electrode and the drain electrode sides, such that the spaced dimension between the polysilicon layers may be accurately set.

A display panel according to the present disclosure includes the thin film transistor according to any one of the present invention.

According to the present disclosure, it is possible to provide a display panel capable of reducing the off-current.

According to the present disclosure, it is possible to reduce the off-current.

The above and further objects and features of the invention will more fully be apparent from the following detailed description with accompanying drawings.

BRIEF DESCRIPTION OF THE DRAWINGS

FIG. 13 is a schematic plan view of main components illustrating the structure of the conventional thin film transistor.

DETAILED DESCRIPTION

Figure 1:
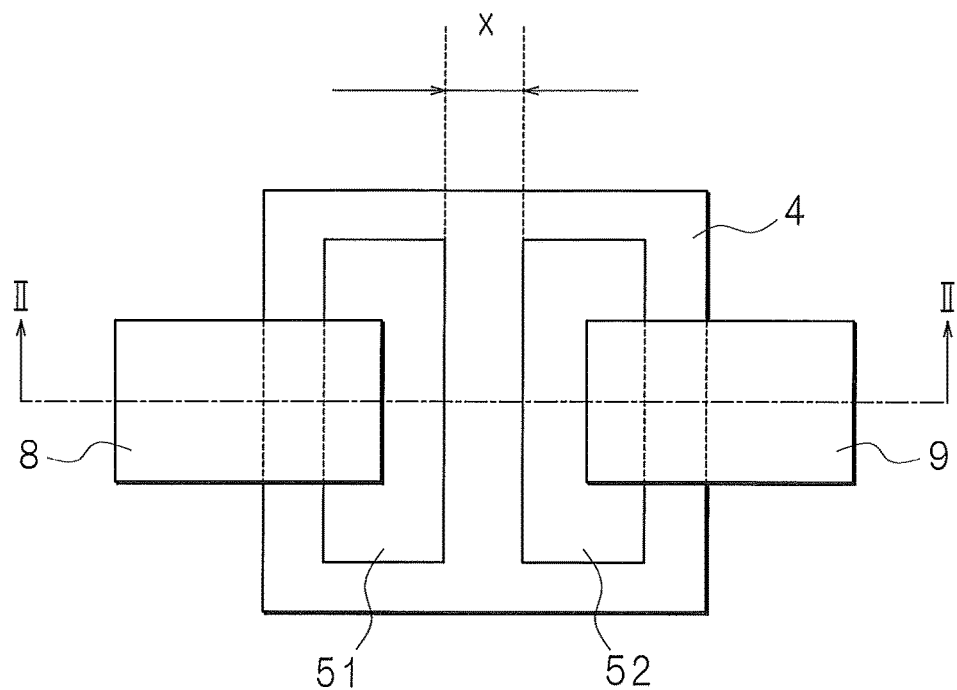
FIG. 1 is a schematic plan view of main components illustrating a first example of a structure of a thin film transistor according to the present embodiment.
Figure 2:
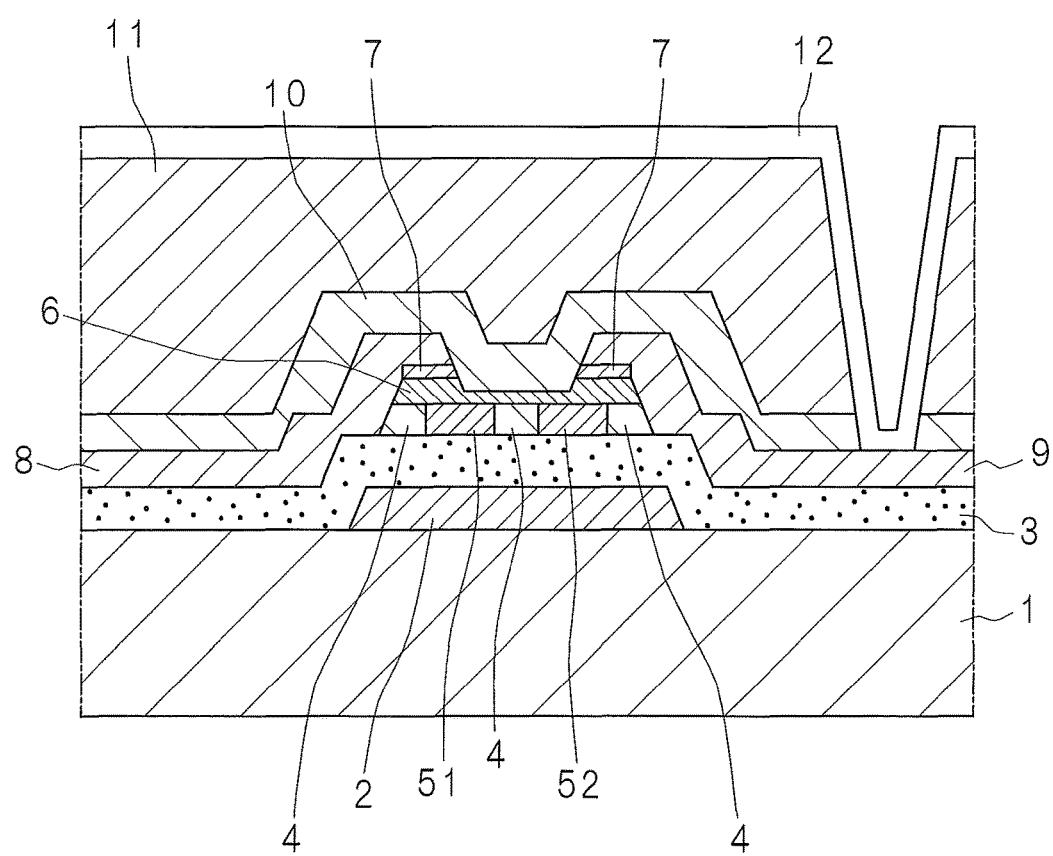
FIG. 2 is a schematic cross-sectional view of the main components as seen from line II-II of FIG. 1.

Hereinafter, embodiments of the present invention will be described with reference to the accompanying drawings illustrating the embodiments thereof. FIG. 1 is a schematic plan view of main components illustrating a first example of a structure of a thin film transistor according to the present embodiment, and FIG. 2 is a schematic cross-sectional view of the main components as seen from line II-II of FIG. 1. As illustrated in FIG. 2, the thin film transistor (TFT, also referred to as a TFT substrate) includes a gate electrode 2 formed on a surface of a glass substrate 1 (also referred to as a substrate), and a gate insulation film 3 (for example, an $SiO_2$ film, $SiO_2$/SiN film laminate, SiN film, SiON, or the like) formed by covering the gate electrode 2.

As illustrated in FIGS. 1 and 2, a first amorphous silicon layer (also referred to as an a-Si film) 4, and a plurality of polysilicon layers 51 and 52 (also referred to as a p-Si films.

Further, herein, the polysilicon layers include not only polycrystals, but also microcrystals having a relatively smaller crystal grain size than the polycrystals or single crystal having higher crystallinity) which are separated by the first amorphous silicon layer 4 and has a required spaced dimension (indicated by symbol X in FIG. 1) are formed on a surface of the gate insulation film 3 and an upper side of the gate electrode 2. In addition, a second amorphous silicon layer 6 (a-Si film) is formed on the upper side of the polysilicon layers 51 and 52 and the first amorphous silicon layer 4. The first amorphous silicon layer 4 and the second amorphous silicon layer 6 are collectively referred to simply as an amorphous silicon layer. Furthermore, for the sake of simplicity, the gate electrode 2, the second amorphous silicon layer 6, and the like are not illustrated in FIG. 1.

An n+ silicon layer (n+ Si film) 7 is formed at a required position on the surface of the second amorphous silicon layer 6. The n+ silicon layer 7 is a contact layer with a source electrode 8 and a drain electrode 9, and is a semiconductor layer having a high impurity concentration such as phosphorus or arsenic.

The source electrode 8 and the drain electrode 9 having required patterns are formed on the surface of the n+ silicon layer 7, the side faces of the second amorphous silicon layer 6 and the first amorphous silicon layer 4, and the surface of the gate insulation film 3.

As illustrated in FIG. 1, when the source electrode 8 and one polysilicon layer 51 are projected onto the surface of the substrate 1, a part of the source electrode 8 and a part of the polysilicon layer 51 are adapted so as to be overlapped with each other. In addition, when the drain electrode 9 and the other polysilicon layer 52 are projected onto the surface of the substrate 1, a part of the drain electrode 9 and a part of the polysilicon layer 52 are adapted so as to be overlapped with each other.

In addition, a channel region between the source electrode 8 and the drain electrode 9 includes two polysilicon layers 51 and 52 formed by separating from each other, and the first amorphous silicon layer 4 which separates the two polysilicon layers 51 and 52 so as to have the required spaced dimension X.

Since the second amorphous silicon layer 6 is intended so as to prevent the source and drain electrodes 8 and 9 and the channel region from directly contacting with each other, a feature of having a low off-current is used. Since the channel region between the source electrode 8 and the drain electrode 9 forms a structure in which the polysilicon layers 51 and 52 are separated by the first amorphous silicon layer 4, it is possible to more reduce the off-current than the case in which the entire channel region is formed as a polysilicon layer.

The present embodiment has a configuration in which the channel region includes the first amorphous silicon layer 4 and the polysilicon layers 51 and 52, and the first amorphous silicon layer 4 separates the polysilicon layers 51 and 52 so as to be spaced apart from each other. Herein, in the first amorphous silicon layer 4 between the polysilicon layers 51 and 52, laser annealing is not performed at all. In other words, when defining by a crystallization rate, the crystallization rate is zero (0).

Figure 15:
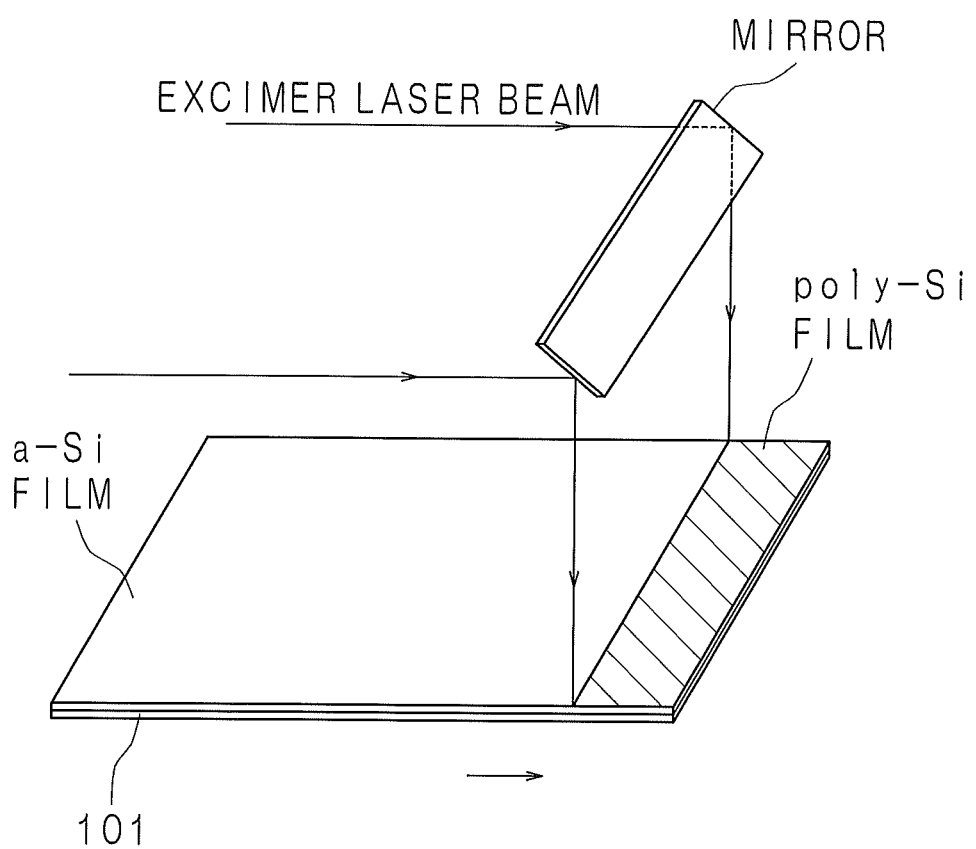
FIG. 15 is a schematic view illustrating an example of a configuration of conventional entire surface irradiation type laser.

When the entire channel region is formed of a polysilicon layer by using an entire surface irradiation type laser as illustrated in FIG. 15, it is possible to employ a method of changing the crystallization rate in a length direction of the channel region of the polysilicon layer for the purpose of reducing the off-current. For example, it is conceivable to increase the crystallization rate of the channel region in the vicinity of the source electrode and the drain electrode, and decrease the crystallization rate near a center of the channel region. However, since the laser annealing is executed over the entire channel region, it is very difficult to leave an amorphous silicon layer having a crystallization rate of 0. In addition, since the crystallization rate is increased to improve the crystallization rate of the entire channel region, it is not possible to set the crystallization rate near the center of the channel region to be 0.

Figure 4:
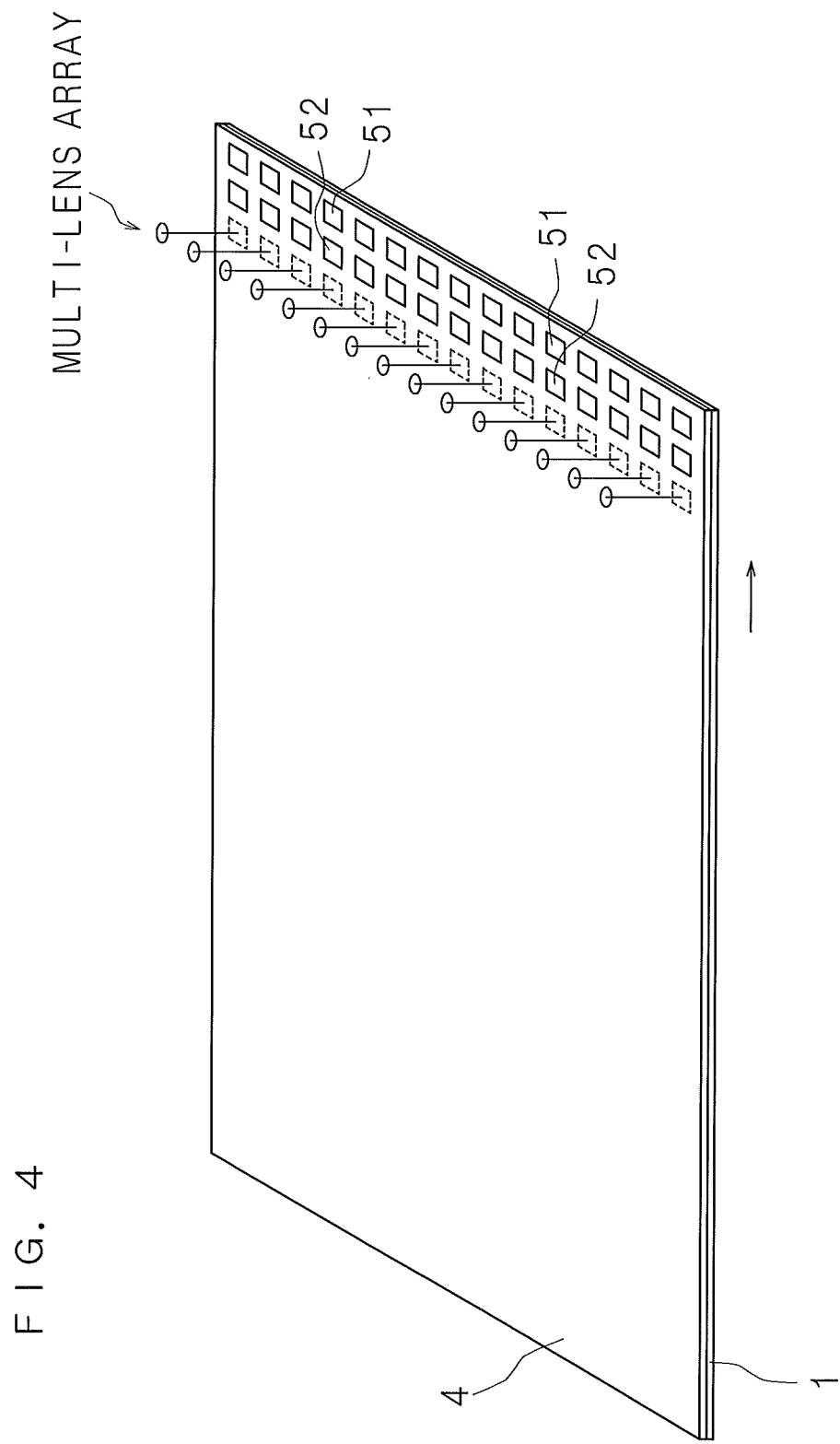
FIG. 4 is a schematic view illustrating an example of a configuration of a partial irradiation type laser.

Further, when the entire channel region is formed of a polysilicon layer by using the entire surface irradiation type laser as illustrated in FIG. 15, it is necessary to use a method of controlling a moving speed of the substrate in order to control the crystallization rate, or the like, and it is difficult to set the crystallization rate to a required value. Compared with this, in the present embodiment, since a partial irradiation type laser as illustrated in FIG. 4 is used, it is possible to freely control the spaced dimension X between the polysilicon layers 51 and 52 to the required value.

As described above, the polysilicon layers 51 and 52, and the first amorphous silicon layer 4 between the polysilicon layers 51 and 52 correspond to the channel region. Further, the first amorphous silicon layer 4, the second amorphous silicon layer 6 and the polysilicon layer 5 are collectively referred to as a semiconductor layer. A TFT including the gate electrode 2, the semiconductor layer, the source electrode 8, the drain electrode 9, and the like illustrated in FIG. 2 shows a TFT for a driving circuit for driving the pixel. Since the TFT for the driving circuit is required to operate at a high speed, the polysilicon layers 51 and 52 having a high electron mobility are used for the channel region. Further, in order to reduce the off-current, the polysilicon layers 51 and 52 are separated by the first amorphous silicon layer 4.

A passivation film 10 made of, for example, SiN is formed on an entire TFT substrate so as to cover the source electrode 8 and the drain electrode 9, and an organic film 11 is formed on a surface of the passivation film 10 to flatten the surface thereof. Through holes are formed in required positions of the passivation film 10 and the organic film 11 so that a pixel electrode 12 and the drain electrode 9 (and the source electrode 8) conduct with each other through the through holes. The pixel electrode 12 is made of a transparent conductive film (for example, ITO or IZO).

Figure 3:
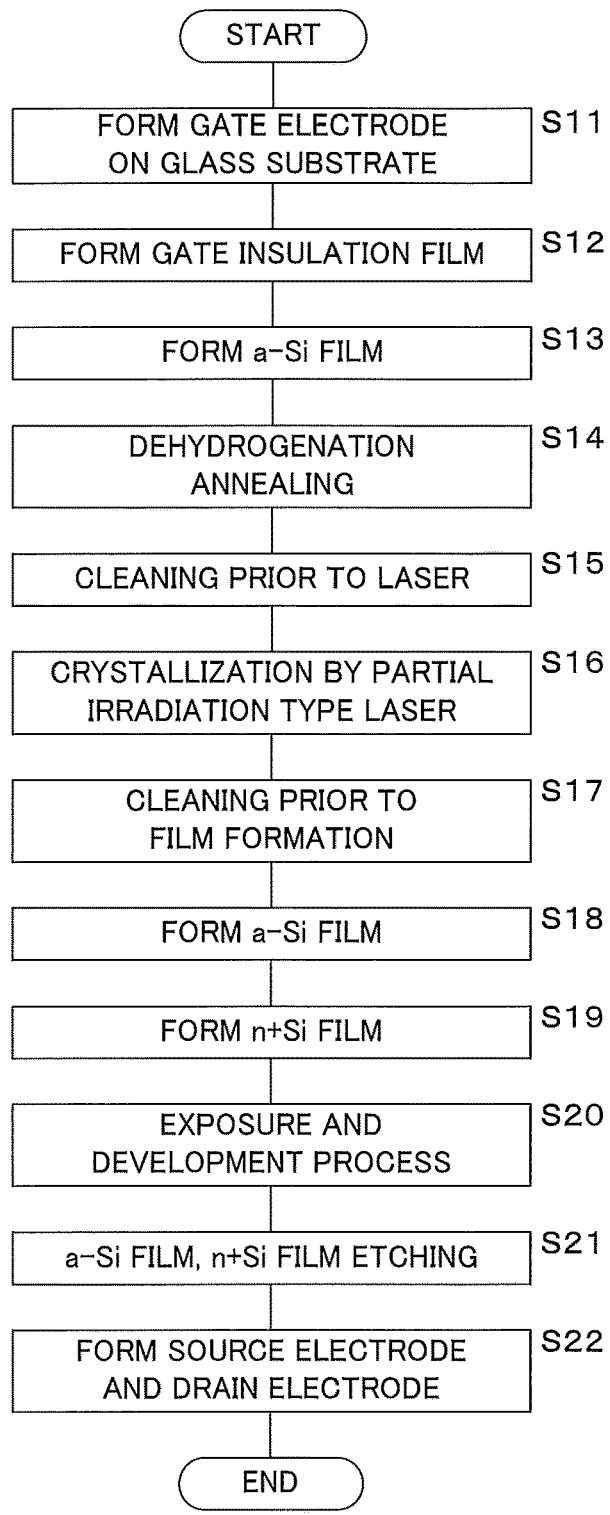
FIG. 3 is a flow chart of manufacturing processes illustrating an example of a method of manufacturing the thin film transistor according to the present embodiment.

FIG. 3 is a flow chart of manufacturing processes illustrating an example of a method of manufacturing the thin film transistor according to the present embodiment. Hereinafter, the manufacturing processes of the thin film transistor according to the present embodiment will be described. As illustrated in FIG. 3, a gate electrode 2 is formed on the glass substrate 1 (S11), and a gate insulation film 3 is formed on the surface of the glass substrate 1 by covering the gate electrode 2 (S12).

Then, an a-Si film 4 as the first amorphous silicon layer is formed on the surface of the glass substrate 1 on which the gate insulation film 3 is formed (S13). In order to laser anneal the a-Si film 4, dehydrogenation annealing treatment is performed (S14), and cleaning prior to laser is performed (S15).

Next, crystallization of the a-Si film 4 by a partial irradiation type laser is performed (S16). The crystallization process is an annealing process (also referred to as a laser annealing process). For example, a required place is changed to the polysilicon layers (poly-Si films) 51 and 52, by irradiating the required place of the a-Si film 4 with an energy beam through a multi-lens array. The required place is on the upper side of the gate electrode 2, and is a part of the channel region between the source and the drain. More specifically, the central portion of the channel region is separated with the first a-Si film 4 thereof in-between, and regions corresponding to the two polysilicon layers 51 and 52 spaced apart from each other are irradiated with the energy beam. For the energy beam, it is possible to use, for example, an excimer laser of ultraviolet light in which absorption of the amorphous silicon layer (a-Si film) is large, or a solid-state laser having a wavelength of a green wavelength or less.

FIG. 4 is a schematic view illustrating an example of a configuration of the partial irradiation type laser. As illustrated in FIG. 4, the glass substrate 1 having the a-Si film 4 formed on the surface thereof is placed on a mount table (not illustrated), and is moved parallel to a direction shown by an arrow in FIG. 4 at a required speed. A multi-lens array, in which individual lenses are arranged by appropriately spacing apart from each other in a direction intersecting the moving direction of the glass substrate 1, is disposed above the glass substrate 1. A laser beam from a laser light source (not illustrated) is made incident on the multi-lens array, and thereby the laser beam is partially irradiated to a plurality of required places spaced apart from each other via different optical paths for each lens. That is, the partial laser annealing may be performed. Thereby, in the a-Si film 4, only the required region of the channel region is selectively changed to polysilicon layers (poly-Si films) 51 and 52.

Then, cleaning prior to film formation is performed (S17), and by covering the polysilicon layers 51 and 52 that have been in the polycrystalline state by the annealing process and the a-Si film 4, an a-Si film 6 as the second amorphous silicon layer is formed (S18). An n+ Si film (n+ silicon layer) 7 is formed on the surface of the a-Si film 6 (S19). The n+ Si film 7 is a contact layer with the source electrode 8 and the drain electrode 9, and is a semiconductor layer having a high impurity concentration such as phosphorus or arsenic.

Next, exposure and development process are performed (S20), and a required pattern is formed on the n+ Si film (n+ silicon layer) 7. The required pattern may be appropriately determined according to an arrangement or structure of the source electrode 8, the drain electrode 9 and the semiconductor layer. Then, in order to make the semiconductor layer have a required structure, the a-Si films 4 and 6 and the n+ Si film 7 are etched (S21), and a source electrode 8 and a drain electrode 9 are formed on the n+ Si film 7 after the etching (S22).

According to the manufacturing method of the present embodiment, the entire surface of the substrate is not irradiated with an energy beam (for example, laser), but, in the first amorphous silicon layer 4, the first amorphous silicon layer 4 of the central portion of the channel region is kept as it is, and only the regions to be the plurality of polysilicon layers 51 and 52 separated with the first amorphous silicon layer 4 in between and spaced apart from each other are partially irradiated with the energy beam, such that it is possible to form the channel region only by the annealing process. Therefore, it is not required for the polysilicon layer crystallized on the entire substrate surface to be subjected to each process of exposure, development and etching process for forming the channel region, and thereby the manufacturing process may be shortened.

Figure 5:
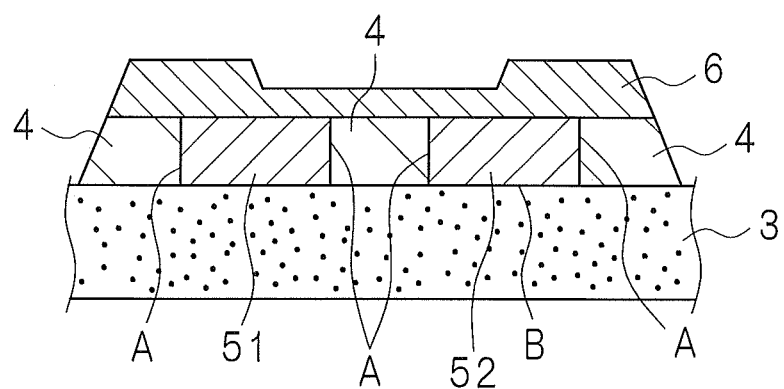
FIG. 5 is a cross-sectional view of main components in the vicinity of a channel region of the thin film transistor of the present embodiment.

FIG. 5 is a cross-sectional view of main components in the vicinity of a channel region of the thin film transistor in the present embodiment. As illustrated in FIG. 5, in the present embodiment, since the polysilicon layers 51 and 52 are formed by partial laser annealing, the boundary surfaces between each of the polysilicon layers 51 and 52 and the first amorphous silicon layer 4 (indicated by symbol A in FIG. 5) may be made to be substantially perpendicular to the surface of the substrate. That is, line widths of the polysilicon layers 51 and 52 on the gate electrode side are not wider than the line widths thereof on the source electrode and the drain electrode sides, such that the spaced dimension between the polysilicon layers 51 and 52 may be accurately set.

In addition, the first amorphous silicon layer 4 has a thickness approximately equal to that of the plurality of polysilicon layers 51 and 52. It can be seen that the plurality of polysilicon layers 51 and 52 are obtained by changing only the region corresponding to a part of the channel region in the first amorphous silicon layer 4 formed on the upper side of the gate electrode 2 in a polycrystalline state, and each processing of exposure, development and etching process for forming the channel region is not performed.

Figure 6:
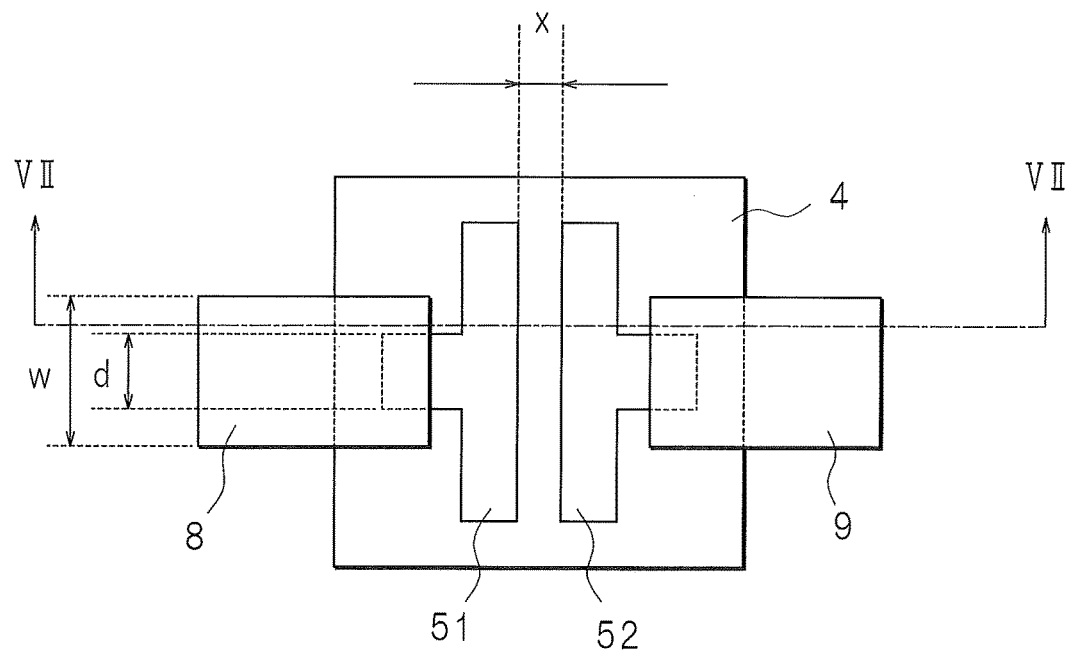
FIG. 6 is a schematic plan view of main components illustrating a second example of the structure of the thin film transistor according to the present embodiment.
Figure 7:
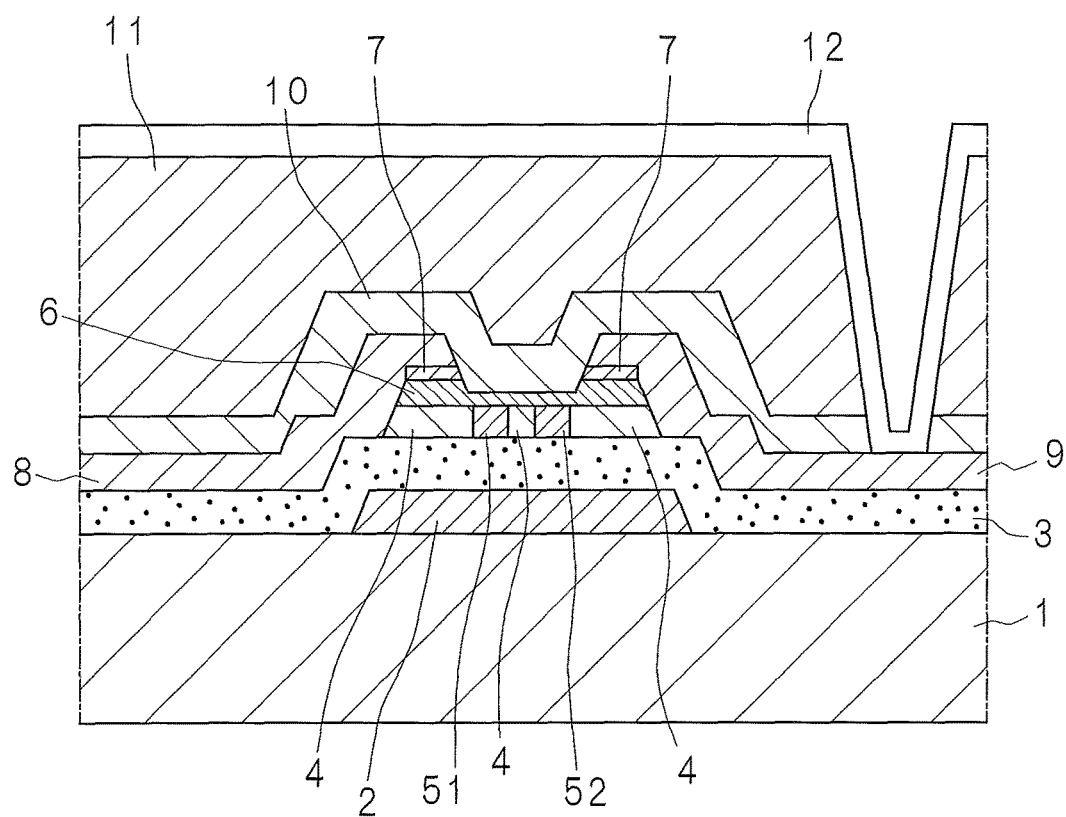
FIG. 7 is a schematic cross-sectional view of the main components as seen from line VII-VII of FIG. 6.

FIG. 6 is a schematic plan view of main components illustrating a second example of the structure of the thin film transistor according to the present embodiment, and FIG. 7 is a schematic cross-sectional view of the main components as seen from line VII-VII of FIG. 6. As illustrated in FIGS. 6 and 7, in the second example, the shapes of the polysilicon layers 51 and 52 in a plan view are different from those in the first example. As illustrated in FIG. 6, a dimension in a width direction intersecting the length direction of the channel region of the source electrode 8 and the drain electrode 9 is represented by W. In addition, a dimension in the width direction of a portion in which the polysilicon layer 51 is overlapped with the source electrode 8, and a dimension in the width direction of a portion in which the polysilicon layer 52 is overlapped with the drain electrode 9 are represented by d, respectively. In this case, the polysilicon layers 51 and 52 are formed so as to have a relation of W>d. Thereby, it is possible to further reduce the off-current between the source electrode 8 and the polysilicon layer 51, and the off-current between the drain electrode 9 and the polysilicon layer 52. Further, in the second example, the dimension in the width direction of the portion in which the polysilicon layer 51 is overlapped with the source electrode 8 is constant, and the dimension in the width direction of the portion in which the polysilicon layer 52 is overlapped with the drain electrode 9 is constant.

Figure 8:
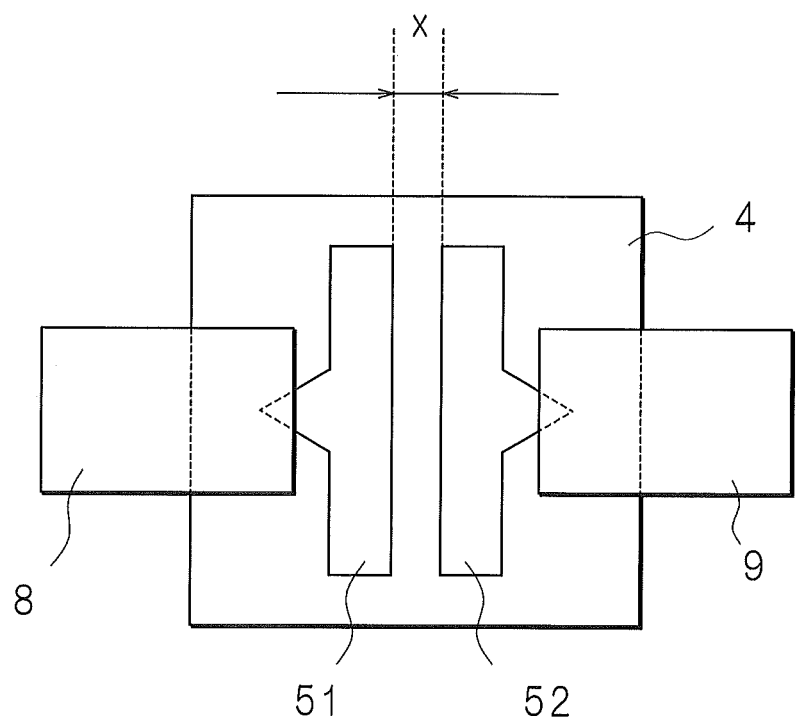
FIG. 8 is a schematic plan view of main components illustrating a third example of the structure of the thin film transistor according to the present embodiment.

FIG. 8 is a schematic plan view of main components illustrating a third example of the structure of the thin film transistor according to the present embodiment. As illustrated in FIG. 8, in the third example, unlike the second example, the dimension in the width direction of the portion in which the polysilicon layer 51 is overlapped with the source electrode 8 is set so as to be decreased toward a tip. In addition, the dimension in the width direction of the portion in which the polysilicon layer 52 is overlapped with the drain electrode 9 is set so as to be decreased toward the tip. Thereby, similar to the second example, it is possible to further reduce the off-current between the source electrode 8 and the polysilicon layer 51, and the off-current between the drain electrode 9 and the polysilicon layer 52.

Figure 9:
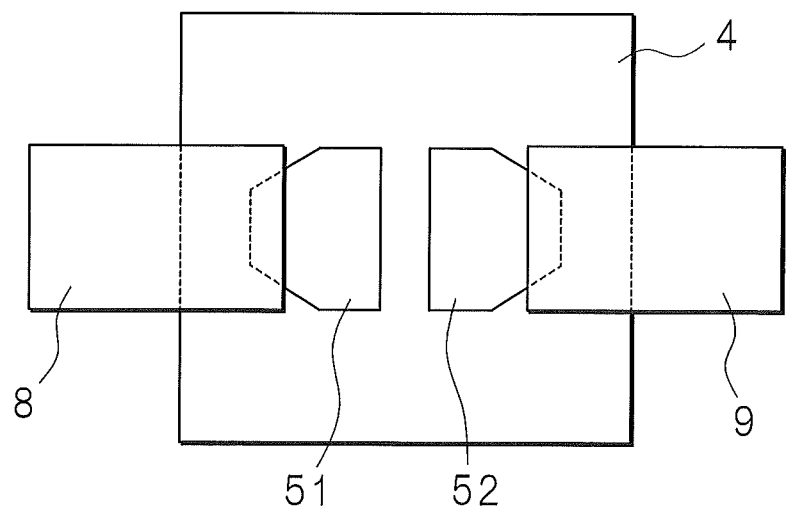
FIG. 9 is a schematic plan view of main components illustrating a fourth example of the structure of the thin film transistor according to the present embodiment.

FIG. 9 is a schematic plan view of main components illustrating a fourth example of the structure of the thin film transistor according to the present embodiment. As illustrated in FIG. 9, in the fourth example, the dimension in the width direction of the polysilicon layers 51 and 52 is substantially the same as the dimension in the width direction of the source electrode 8 and the drain electrode 9. Further, a width dimension of the polysilicon layer 51 is set so as to be decreased toward the source electrode 8 from a middle thereof. In addition, a width dimension of the polysilicon layer 52 is set so as to be decreased toward the drain electrode 9 from a middle thereof. Thereby, similar to the third example, it is possible to further reduce the off-current between the source electrode 8 and the polysilicon layer 51, and the off-current between the drain electrode 9 and the polysilicon layer 52.

Figure 10:
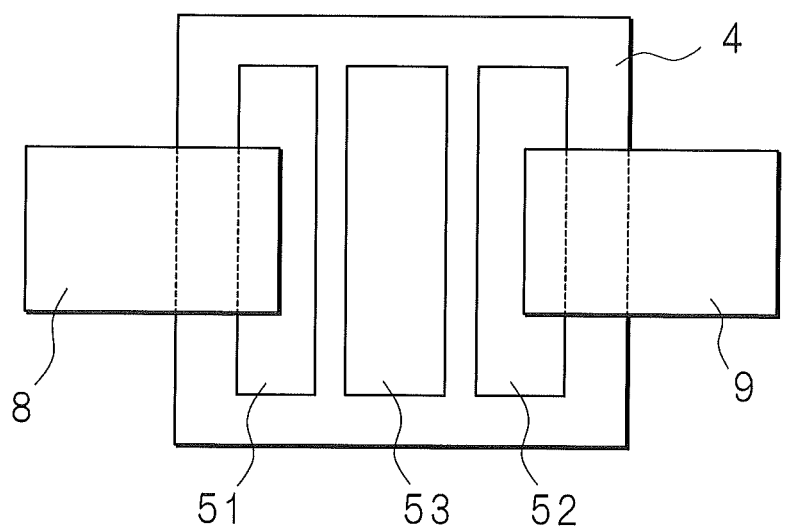
FIG. 10 is a schematic plan view of main components illustrating a fifth example of the structure of the thin film transistor according to the present embodiment.

FIG. 10 is a schematic plan view of main components illustrating a fifth example of the structure of the thin film transistor according to the present embodiment. As illustrated in FIG. 10, in the fifth example, the channel region includes three polysilicon layers 51, 52 and 53, wherein the polysilicon layers 51 and 53 are separated and spaced apart from each other by the first amorphous silicon layer 4, and the polysilicon layers 52 and 53 are separated and spaced apart from each other by the first amorphous silicon layer 4. Thereby, it is possible to more reduce the off-current than the case in which the entire channel region is formed as a polysilicon layer. In addition, similar to the first example, when the source electrode 8 and the polysilicon layer 51 are projected on the surface of the substrate 1, a part of the source electrode 8 and a part of the polysilicon layer 51 are adapted so as to be overlapped with each other. In addition, when the drain electrode 9 and the polysilicon layer 52 are projected on the surface of the substrate 1, a part of the drain electrode 9 and a part of the polysilicon layer 52 are adapted so as to be overlapped with each other. Further, a sum of the spaced dimension between the polysilicon layers 51 and 53 and the spaced dimension between the polysilicon layers 53 and 52 may be set to be approximately equal to the spaced dimension X of the first example.

Furthermore, although not illustrated in the drawings, as a sixth example, the dimension in the width direction of the polysilicon layers 51 and 52 of the first example may be smaller than the dimension in the width direction of the source electrode 8 and the drain electrode 9.

Figure 11:
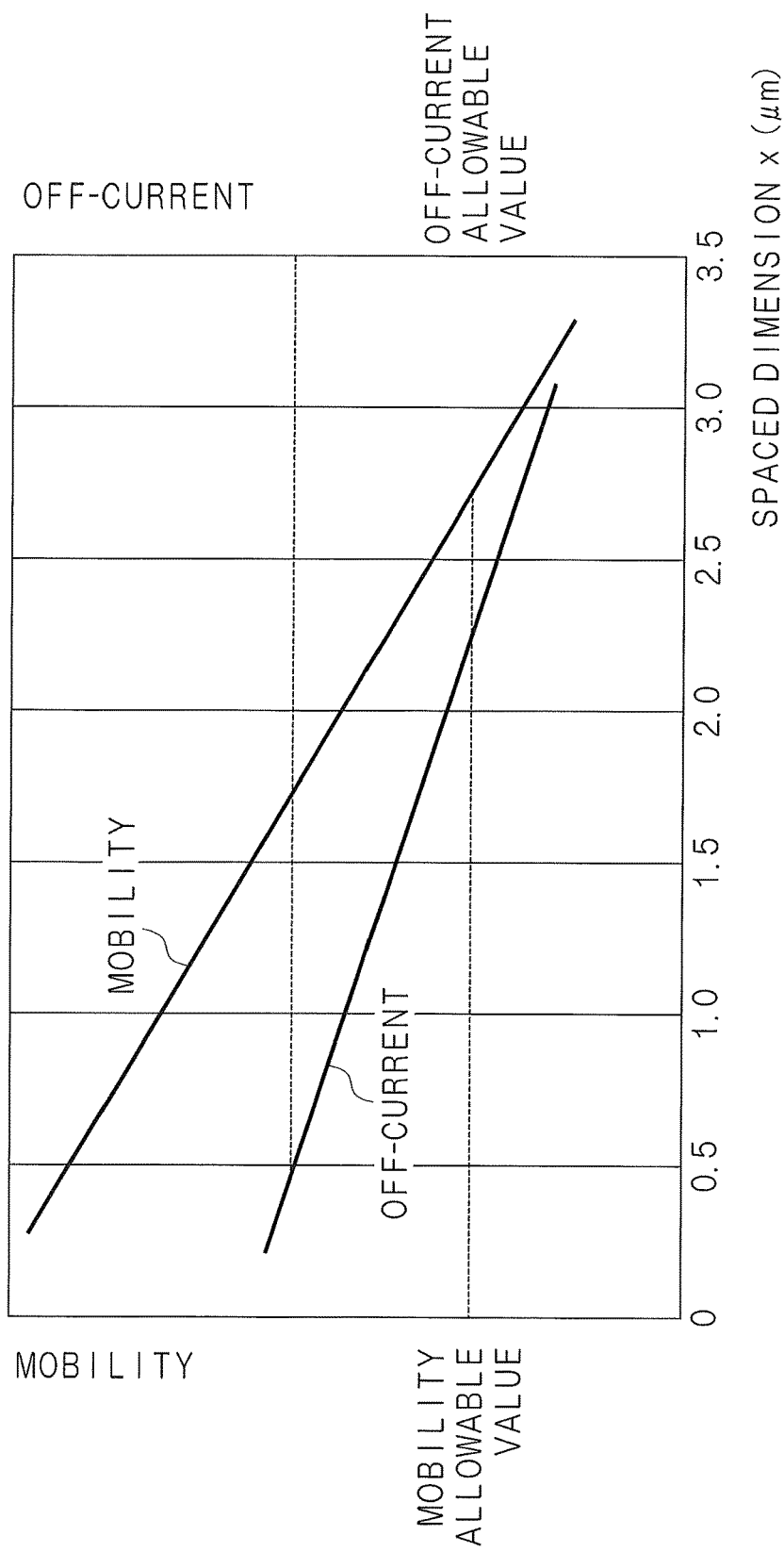
FIG. 11 is a schematic view illustrating an example of mobility and an off-current of the thin film transistor according to the present embodiment.

FIG. 11 is a schematic view illustrating an example of mobility and an off-current of the thin film transistor according to the present embodiment. In FIG. 11, a horizontal axis represents the spaced dimension X between the polysilicon layers 51 and 52, and a vertical axis represents the mobility and the off-current. As illustrated in FIG. 11, the mobility of the thin film transistor has a characteristic of decreasing as the spaced dimension X is increased. Further, the off-current also has a characteristic of decreasing as the spaced dimension X is increased. Furthermore, straight lines representing the mobility and the off-current in FIG. 11 are schematically shown for the sake of simplicity, and may be different from the actual characteristics.

The spaced dimension X between the polysilicon layers 51 and 52 in the channel region is within a range of 0.1 µm to 5 µm. As the conventional thin film transistor, in the process in which the entire substrate having the a-Si layer formed thereon is irradiated with a laser to change the a-Si layer to the p-Si layer in a polycrystalline state, and after the crystallization, the p-Si layer is formed using exposure, development and etching processes, it is very difficult to reduce the spaced dimension between adjacent polysilicon layers to less than 5 µm. On the other hand, by using the method in which a laser beam from the laser light source is made incident on the multi-lens array, for example, as illustrated in FIG. 4, and the laser beam is partially irradiated via different optical paths for each lens (partial laser annealing), it is possible to decrease the spaced dimension between the adjacent polysilicon layers to about 0.1 µm. That is, by using the partial laser annealing, the spaced dimension between the polysilicon layers separated by the first amorphous silicon layer in the channel region may be set within the range of 0.1 µm to 5 µm.

Further, the spaced dimension X between the polysilicon layers 51 and 52 in the channel region may be set within a range of 1 µm to 2 µm. If the spaced dimension is set to be larger than 2 µm, a ratio of a length of the amorphous silicon layer 4 to a length of the channel region is increased, and the mobility of electrons in the channel region is decreased. For example, as illustrated in FIG. 11, when the mobility is less than an allowable value near 2.5 µm of the spaced dimension X, the spaced dimension X may be set to be 2.5 µm or less, and preferably 2 µm or less in consideration of an error.

Meanwhile, if the spaced dimension X is set to be smaller than 1 µm, the ratio of the length of the amorphous silicon layer 4 to the length of the channel region becomes small, and the off-current exceeds the allowable value (for example, about 1 pA). For example, as illustrated in FIG. 11, when the off-current exceeds an allowable value if the spaced dimension X exceeds near 0.5 µm, the spaced dimension X may be set to be 0.5 µm or more, and preferably 1 µm or more in consideration of the error.

Therefore, by setting the spaced dimension X within the range of 1 µm to 2 µm, for example, it is possible to reduce the off-current without decreasing the mobility of electrons in the channel region.

Figure 12:
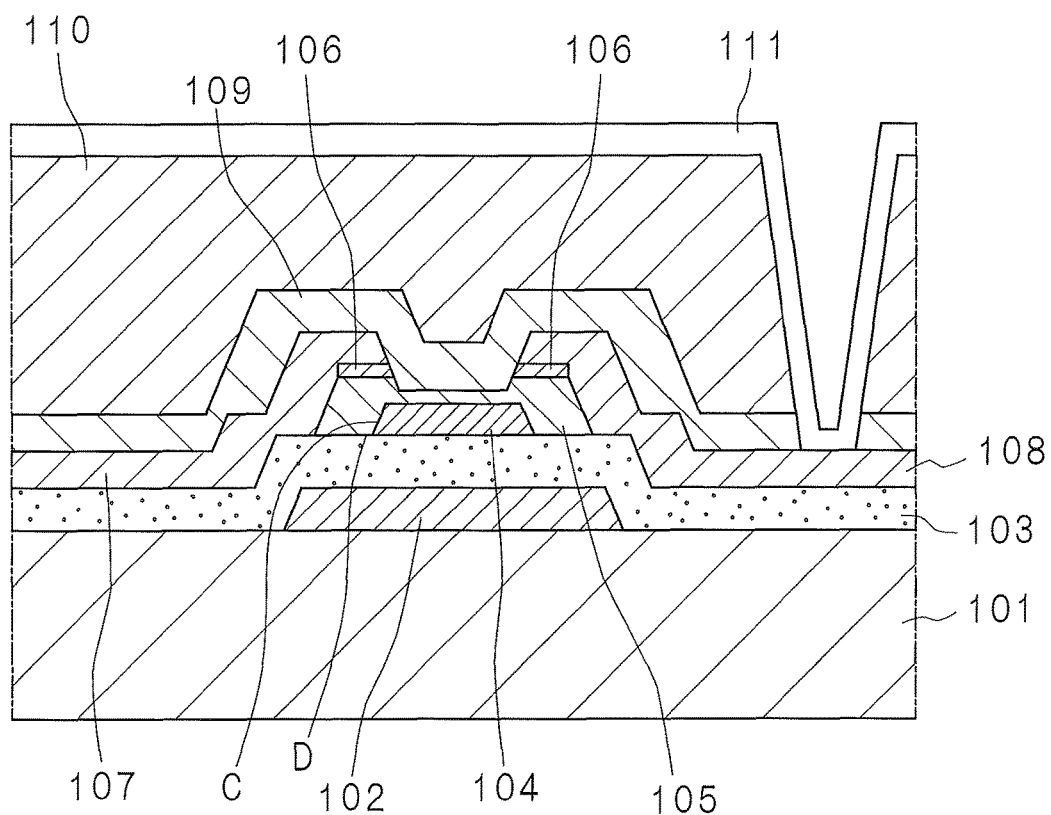
FIG. 12 is a schematic cross-sectional view of main components illustrating a structure of a conventional thin film transistor.

Next, the conventional TFT as a comparative example will be described. FIG. 12 is a schematic cross-sectional view of main components illustrating a structure of the conventional thin film transistor, and FIG. 13 is a schematic plan view of main components illustrating the structure of the conventional thin film transistor. The conventional thin film transistor includes a gate electrode 102 formed on the surface of a glass substrate 101, and a gate insulation film 103 formed by covering the gate electrode 102. A polysilicon layer (poly-Si film) 104 is formed on the surface of the gate insulation film 103 and the upper side of the gate electrode 102.

An amorphous silicon layer (a-Si film) 105 is formed on the polysilicon layer 104 so as to cover the same. An n+ silicon layer (n+ Si film) 106 is formed at a required position on the surface of the amorphous silicon layer 105. A source electrode 107 and a drain electrode 108 respectively having a required pattern are formed on the surface of the n+ silicon layer 106, the side face of the amorphous silicon layer 105, and the surface of the gate insulation film 103. In addition, as illustrated in FIG. 12, the entire channel region is formed by the polysilicon layer 104. Therefore, there is a problem that the mobility of electrons is high, but the off-current is increased.

In addition, in the conventional thin film transistor illustrated in FIG. 12, the polysilicon layer 104 is formed by photo etching, such that, as illustrated by symbol C in FIG. 12, a boundary surface between the polysilicon layer 104 and the amorphous silicon layer 105 is not substantially perpendicular to a plane parallel to the surface of the substrate (indicated by symbol D), and is formed in a taper shape. Therefore, the line widths are different from each other between the upper surface side and the lower surface side of the polysilicon layer 104, and the line width thereof on the lower surface side becomes wider than the upper surface side. Accordingly, in the conventional thin film transistor, it is difficult to set the length and width of the polysilicon layer 104 to required values.

Figure 14:
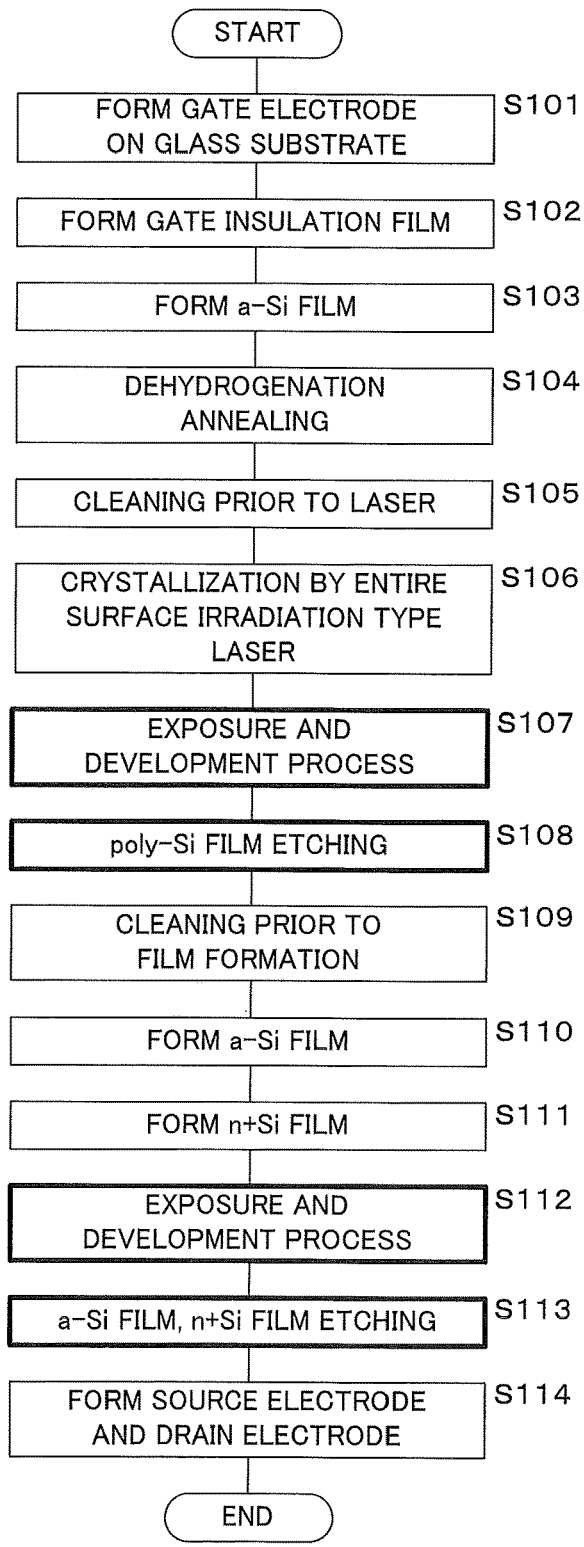
FIG. 14 is a flow chart of manufacturing processes illustrating a method for manufacturing the conventional thin film transistor.

FIG. 14 is a flow chart of manufacturing processes illustrating a method for manufacturing the conventional thin film transistor. As illustrated in FIG. 14, a gate electrode 102 is formed on the glass substrate 101 (S101), and a gate insulation film 103 is formed on the surface of the glass substrate 101 by covering the gate electrode 102 (S102).

An a-Si film is formed on the surface of the glass substrate 101 on which the gate insulation film 103 is formed (S103). In order to laser anneal the a-Si film, dehydrogenation annealing treatment is performed (S104), and cleaning prior to laser treatment is performed (S105).

Next, crystallization of the a-Si film by an entire surface irradiation type laser is performed (S106).

FIG. 15 is a schematic view illustrating an example of a configuration of the entire surface irradiation type laser. As illustrated in FIG. 15, the glass substrate 101 having the a-Si film formed on the surface thereof is placed on a mount table (not illustrated), and is moved parallel to a direction shown by an arrow in FIG. 15 at a required speed. A mirror having a length substantially the same as the dimension in a width direction of the glass substrate 101 (direction intersecting the direction of parallel movement) is disposed above the glass substrate 101. A laser beam from a laser light source (not illustrated) is made incident on the mirror, thereby the laser beam is irradiated to the entire surface of the glass substrate 101. As a result, all of the a-Si film is changed to the polysilicon layer (p-Si film).

Next, exposure and development process are performed on the polysilicon layer (p-Si film) formed on the whole of the surface of the glass substrate 101 (S107), and further etching processing is performed thereon (S108). Thereby, the polysilicon layer 104 as the channel region is formed.

Then, cleaning prior to film formation is performed (S109), and an a-Si film 105 is formed by covering the polysilicon layer 104 (S110). An n+ Si film (n+ silicon layer) 106 is formed on the surface of the a-Si film 105 (S111).

Next, exposure and development process are performed (S112), and in order to make the semiconductor layer have a required structure, the a-Si film 105 and the n+ Si film 106 are etched (S113). Then, a source electrode 107 and a drain electrode 108 are formed on the n+ Si film 106 after the etching (S114).

As illustrated in FIG. 14, as compared to the conventional case in which, after the amorphous silicon layer formed on the whole of the substrate surface is changed to the polysilicon layer by irradiating the entire surface of the substrate with an energy beam (for example, laser), each process of exposure, development and etching process is performed on the polysilicon layer to form the channel region, according to the manufacturing method of the present embodiment, the entire surface of the substrate is not irradiated with the energy beam (for example, laser), but, in the first amorphous silicon layer, only the required region of the channel region is partially irradiated with the energy beam, such that it is possible to form the polysilicon layer in the channel region only by the annealing process. Therefore, each process of exposure, development and etching process (steps S107 and S108 illustrated in FIG. 14) for forming the channel region is not required, and thereby the manufacturing process may be shortened.

The thin film transistor of the present embodiment may be used for a display panel. That is, the thin film transistor (TFT substrate) of the present embodiment and a color filter substrate having red (R), green (G) and blue (B) colors are bonded to each other at a required gap, and liquid crystal is injected and sealed between the TFT substrate and the color filter substrate, such that a TFT type liquid crystal display panel (liquid crystal display) may be manufactured. Thereby, it is possible to provide a display panel having a reduced off-current.

It is to be noted that, as used herein and in the appended claims, the singular forms "a", "an", and "the" include plural referents unless the context clearly dictates otherwise.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A thin film transistor, comprising:
    a gate electrode formed on a surface of a substrate;
    a first amorphous silicon layer formed on an upper side of the gate electrode;
    a plurality of polysilicon layers separated by the first amorphous silicon layer and formed on the upper side of the gate electrode with a required spaced dimension;
    a second amorphous silicon layer and an n+ silicon layer which are formed on the upper side of the plurality of polysilicon layers and the first amorphous silicon layer; and
    a source electrode and a drain electrode formed on the n+ silicon layer, wherein
    when viewed from a normal direction of the substrate, a part of the source electrode and a part of one polysilicon layer are adapted so as to be overlapped with each other, and a part of the drain electrode and a part of another polysilicon layer are adapted so as to be overlapped with each other.

2. The thin film transistor according to claim 1, wherein the spaced dimension is in a range of 0.1 µm to 5 µm.

3. The thin film transistor according to claim 1, wherein the spaced dimension is in a range of 1 µm to 2 µm.

4. The thin film transistor according to claim 1, wherein the first amorphous silicon layer has a thickness approximately equal to that of the plurality of polysilicon layers.

5. The thin film transistor according to claim 1, wherein a boundary surface between the plurality of polysilicon layers and the first amorphous silicon layer is substantially perpendicular to the surface of the substrate.

6. The thin film transistor according to claim 1, wherein the part of one polysilicon layer is disposed below an edge on the drain electrode side of the source electrode, and the part of the another polysilicon layer is disposed below an edge on the source electrode side of the drain electrode.

7. The thin film transistor according to claim 1, wherein a width of a portion of the one polysilicon layer in which the one polysilicon layer is overlapped with the source electrode is smaller than a width of the source electrode, and a width of a portion of the another polysilicon layer in which the another polysilicon layer is overlapped with the drain electrode is smaller than a width of the drain electrode.

8. The thin film transistor according to claim 1, wherein a width of a portion of the one polysilicon layer in which the one polysilicon layer is overlapped with the source electrode is set so as to be decreased toward a tip, and a width of a portion of the another polysilicon layer in which the another polysilicon layer is overlapped with the drain electrode is set so as to be decreased toward a tip.

9. A display panel comprising the thin film transistor according to claim 1.

* * * * *